(12) United States Patent
Chen et al.

(10) Patent No.: US 8,403,247 B2
(45) Date of Patent: *Mar. 26, 2013

(54) SLIDER CASE HAVING CABLE RETRACTOR

(76) Inventors: Ko-An Chen, Taipei (TW); Wen-Han Chang, Taipei (TW)

(*) Notice: Subject to any disclaimer, the term of this patent is extended or adjusted under 35 U.S.C. 154(b) by 277 days.

This patent is subject to a terminal disclaimer.

(21) Appl. No.: 12/959,394

(22) Filed: Dec. 3, 2010

(65) Prior Publication Data

US 2012/0138725 A1    Jun. 7, 2012

(51) Int. Cl.
*B65H 75/48*    (2006.01)
(52) U.S. Cl. ........................................ 242/378; 242/379
(58) Field of Classification Search .................. 242/378, 242/378.1–378.4, 379; 191/12.2 R
See application file for complete search history.

(56) References Cited

U.S. PATENT DOCUMENTS

| 4,569,490 | A | * | 2/1986 | Church | 242/375.3 |
| 7,364,109 | B2 | * | 4/2008 | Kuo | 242/373 |
| 7,523,883 | B2 | * | 4/2009 | Cheng | 242/378 |
| 7,607,603 | B1 | * | 10/2009 | Chang | 242/378.1 |
| 8,262,009 | B2 | * | 9/2012 | Todd et al. | 242/388 |
| 2006/0214044 | A1 | * | 9/2006 | Chiang | 242/378 |
| 2012/0138724 | A1 | * | 6/2012 | Chen et al. | 242/378.1 |

* cited by examiner

*Primary Examiner* — Sang Kim
(74) *Attorney, Agent, or Firm* — Leong C. Lei

(57) ABSTRACT

The slider case provides housing for a portable appliance and integrates a cable retractor containing a coil spring, a rotary disc, a cable, and a winding disc. The rotary disc has a top circular indentation where the coil spring is accommodated in the indentation. A number of gear teeth are provided around the rotary disc and the winding disc. The winding disc has a central axle for the winding of the cable. The winding disc is positioned such that its teeth engage those of the rotary disc. A spiral track and a centrifugal track are provided on the rotary disc and the casing member, respectively. A positioning ball, together with the spiral track and the centrifugal track, provides a positioning function. The cable can be configured to be pulled in a single direction with a connector or multiple directors at a free end.

5 Claims, 4 Drawing Sheets

SLIDER CASE HAVING CABLE RETRACTOR

TECHNICAL FIELD OF THE INVENTION

The present invention is generally related to cable retractors and more particularly to a cable retractor whose winding disc and coil spring are arranged laterally so as to reduce the height of the cable retractor, thereby cable of being integrated with a slider case.

DESCRIPTION OF THE PRIOR ART

Due to the wide popularity of various portable appliances, such as mobile phones, notebook or tablet computers, etc., various protective covers and slider cases are introduced to provide additional protection to the appliance and to facilitate its transportation. Other than this protective function, these protective covers and slider cases do not have additional features.

On the other hand, various cables for these appliances, such as earphone cables, signal cables, power cables, etc., have become necessary auxiliaries but they are often tangled and twisted together and therefore rather annoying to the users.

Conventionally, people just wind the cables to some desired length and tie them up. However, this still cannot prevent the cables from tangling. Most importantly, cable being wound and tied for too long would cause its transmission and safety quality to deteriorate.

As such, cable retractors are produced and introduced to solve the cable management problem. A conventional cable retractor involves a winding disc where the cable is wound on one side and a coil spring is provided on the other side. When the cable is pulled out, the coil spring is tightened and, when the coil spring is released, the cable is reeled back in. As the coil spring and the cable are stacked vertically, the cable retractor cannot be downsized to make it more compact.

SUMMARY OF THE INVENTION

As such, a novel slider case having an integrated cable retractor is provided where the cable retractor's winding mechanism is laterally arranged so that the height of the cable retractor could be significantly reduced and so that it could be integrated with the slider case.

The slider case mainly contains a casing member, a coil spring, a rotary disc, a cable, a winding disc, a base plate, and a flip-open cover. The casing member forms a space for a portable appliance to slide in. The base plate is positioned between the space and the casing member to form a thin space to house a cable retractor containing the coil spring, the rotary disc, the cable, and the winding disc.

The rotary disc has a top circular indentation where the coil spring is accommodated in the indentation. Depending on whether the rotary disc spins clockwise or counter-clockwise, the coil spring is tightened or loosed. A number of gear teeth are provided around the rotary disc. A number of gear teeth are also provided along the winding disc. The winding disc has a central axle for the winding of the cable. The winding disc is positioned such that its teeth engage those of the rotary disc.

A spiral track and a centrifugal track are provided on the rotary disc and the casing member, respectively. A positioning ball, together with the spiral track and the centrifugal track, provides a positioning function. As the rotary disc spins, the winding disc is engaged to rotate in the opposite direction as well. Every time the winding disc is rotated one round, the positioning ball is allowed to temporarily stop the cable at its current extended length.

The cable can be configured to be pulled in a single direction with a connector or multiple directors at a free end.

For the single-connector configuration, a connector is configured at a free end of the cable while a positive wire and a negative wire out of the other end of the cable are connected to an upper embedded element. The upper embedded element connects one of the positive and negative wires to an upper conducting plate, and the other wire to a lower conducting plate through a lower embedded element. On the other hand, the positive and negative wires of another connector of fixed length are connected to the upper and lower conducting plates, respectively.

As to the two-connector configuration, the cable is bended at a central location and the central location is fixed to the central axle of the winding disc. The entire cable is then wound around the central axle so that two connectors at the two ends of the cable could be pulled and extended in the same direction.

The foregoing objectives and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts.

Many other advantages and features of the present invention will become manifest to those versed in the art upon making reference to the detailed description and the accompanying sheets of drawings in which a preferred structural embodiment incorporating the principles of the present invention is shown by way of illustrative example.

BRIEF DESCRIPTION OF THE DRAWINGS

FIG. 2-1 is schematic diagram showing a spiral tack on a bottom side of a rotary disc functioning as the positioning mechanism of the cable retractor for the slider case of FIG. 1.

DETAILED DESCRIPTION OF THE PREFERRED EMBODIMENTS

The following descriptions are exemplary embodiments only, and are not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Figure 1:
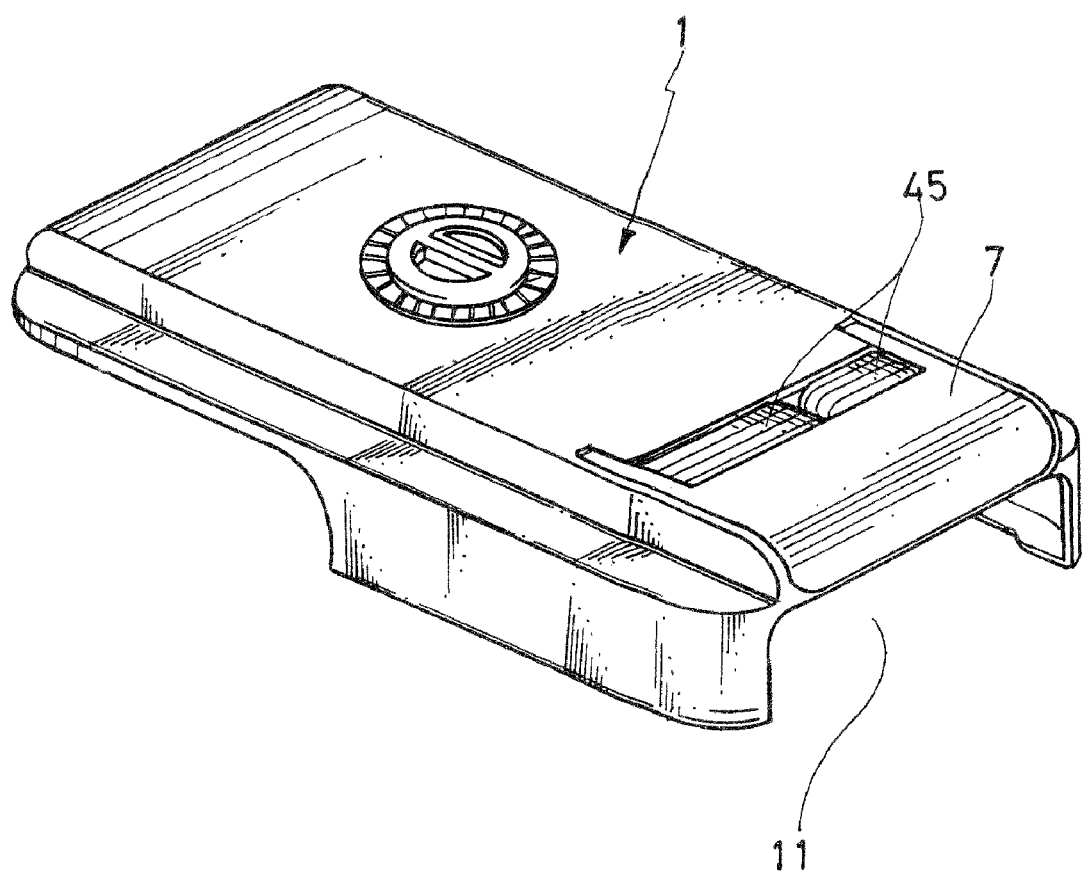
FIG. 1 is a perspective schematic diagram showing a slider case having a cable retractor according to an embodiment of the present invention which provides a retractable cable with two connectors at a free end.
Figure 2:
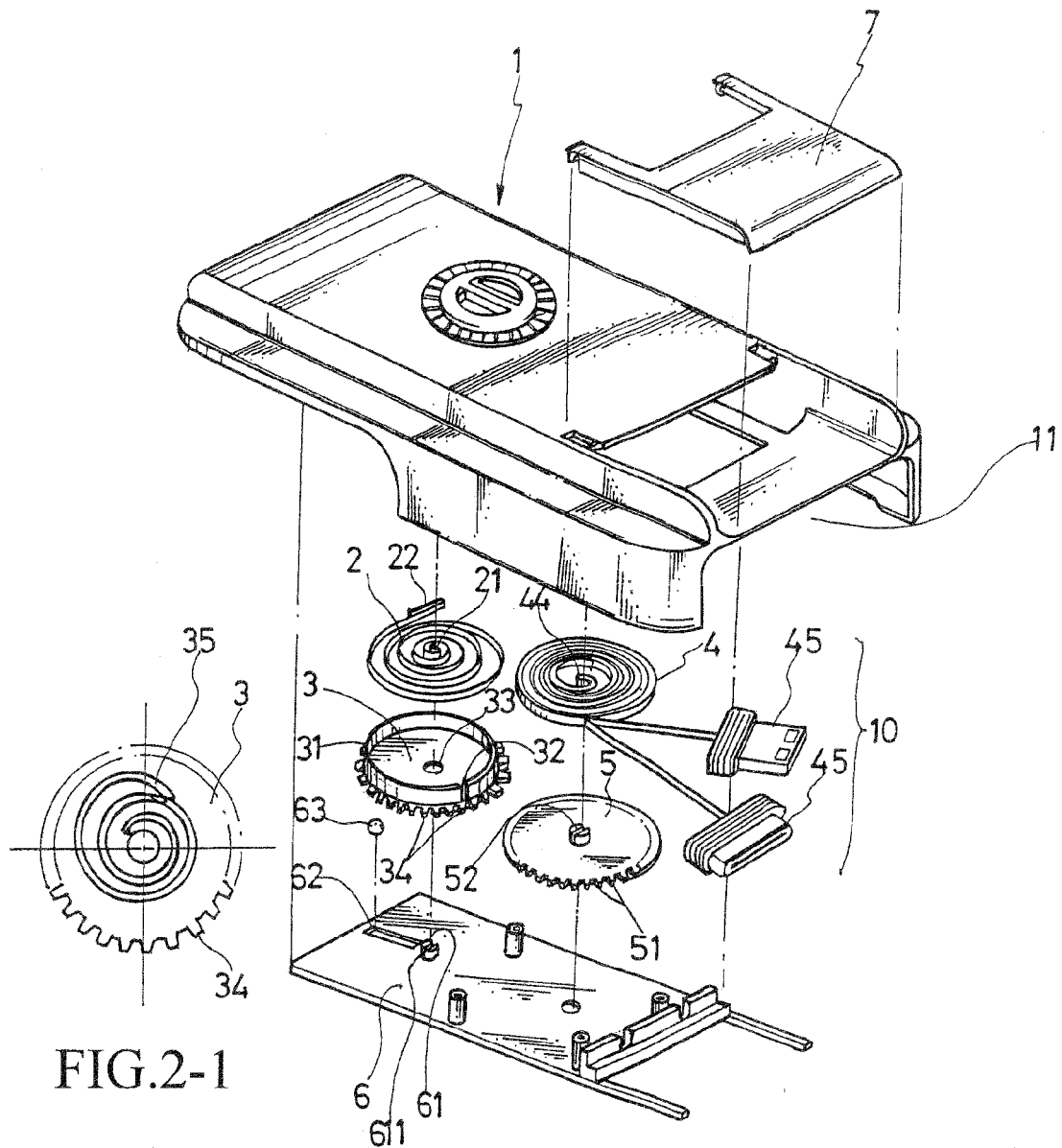
FIG. 2 is a perspective break-down diagram showing the various components of the slider case of FIG. 1.

As shown in FIGS. 1 and 2, a slider case having an integrated cable retractor according to an embodiment of the present invention mainly contains a casing member 1, a coil spring 2, a rotary disc 3, a cable 4, a winding disc 5, a base plate 6, and a flip-open cover 7. The casing member 1 forms a space 11 for a portable appliance to slide in. The base plate 6 is positioned between the space 11 and the casing member 1 to form a thin space to house a cable retractor 10 containing the coil spring 2, the rotary disc 3, the cable 4, and the winding disc 5.

As shown in FIG. 2, the rotary disc 3 has a top circular indentation 31 with a central through hole 33. The rotary disc 3 is axially mounted on a pin 61 on the base plate 6 so that the rotary disc 3 freely spins around the pin 61. The coil spring 2, accommodated in the indentation 31, has an inner end 21 embedded into a notch 611 on a top end of the pin 61, and an outer end 22 embedded into a notch 32 along a circumferential wall of the indentation 31. As such, depending on whether the rotary disc 3 spins clockwise or counter-clockwise, the coil spring 2 is tightened or loosed. A number of gear teeth 34 are provided around the rotary disc 3 for engaging with the winding disc 5.

A number of gear teeth 51 for engaging with those of the rotary disc 3 are provided along a section of the circumference of the winding disc 5. The winding disc 5 has a central axle 52 for the winding of the cable 4. Additionally, the winding disc 5 is rotatably mounted to the casing member 1 around the axle 52. The winding disc 5 is positioned such that its teeth 51 engage those of the rotary disc 3. As such, the winding disc 5 rotates along with the rotary disc 3's spinning, and the energy stored in and released from the coil spring 2 is delivered to the winding disc 5 to wind or unwind the cable 4.

As shown in FIG. 2-1, a spiral track 35 and a centrifugal track 62 are provided on a back side of the rotary disc 3 and the base plate 6, respectively. A positioning ball 63 is movably positioned inside the spiral track 35 and the centrifugal track 62. Together with the spiral track 35 and the centrifugal track 62, the positioning ball 63 provides a positioning function capable of temporarily stopping the extension and winding of the cable in successive steps. When the cable 4 is pulled, the winding disc 5 is rotated and the rotary disc 3 is engaged to spin, the coil spring 2 is tightened and energy is stored for later retracting the cable 4. To retract the cable 4, the coil spring 2 is released and the rotary disc 3 spins in the opposite direction by the energy stored in the coil spring 2. As the rotary disc 3 spins, the winding disc 5 is engaged to rotate in the opposite direction as well to wind the cable 4 back in. Every time the winding disc 5 is rotated one round (equivalent to a round of the rotary disc 3), the positioning ball 6 is allowed to temporarily stop the cable 4 at its current extended length. Therefore, during the pulling and releasing the cable 4, there are multiple chances to stop the cable 4 at various lengths.

Figure 3:
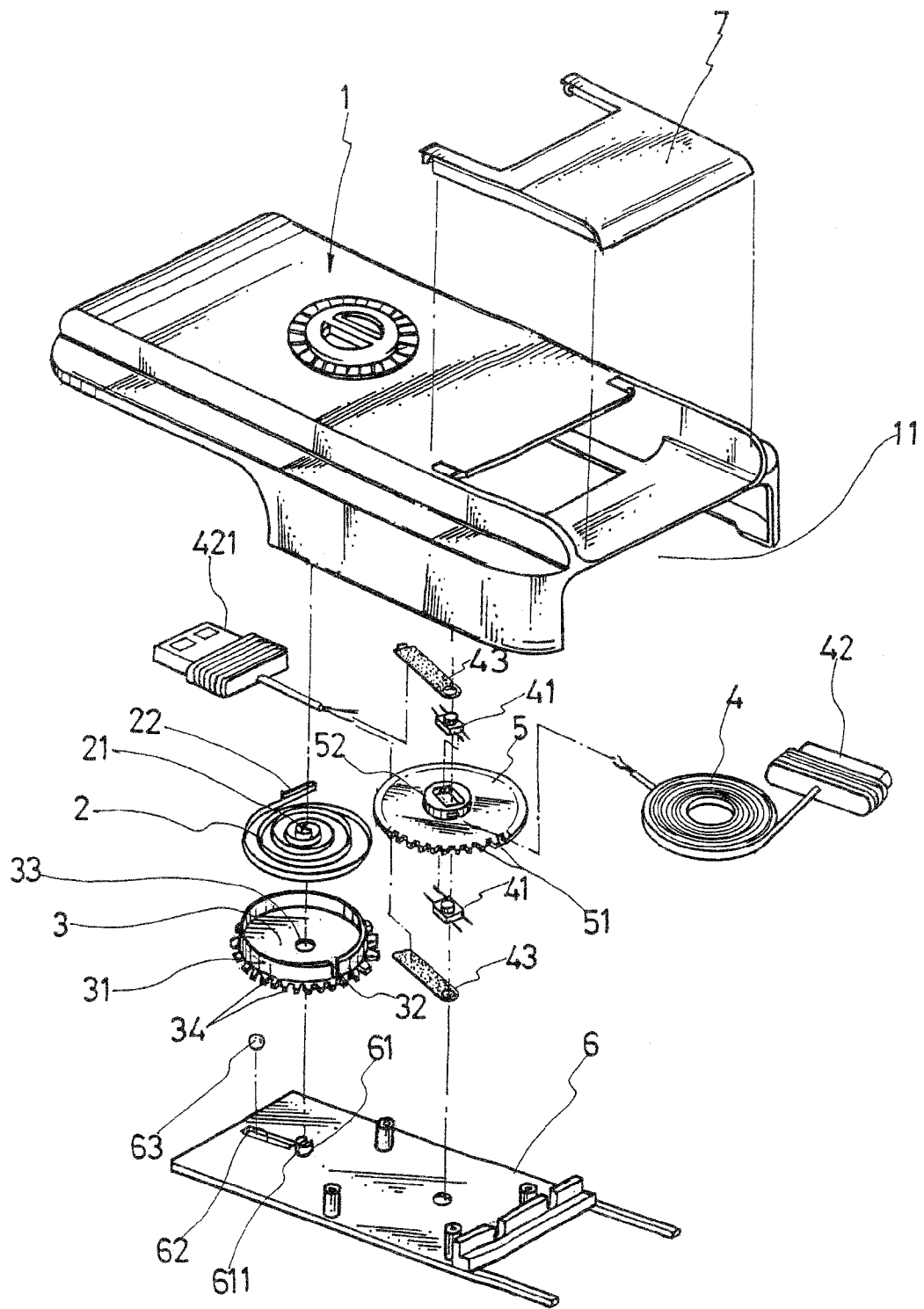
FIG. 3 is a perspective schematic diagram showing a slider case having a cable retractor according to another embodiment of the present invention which provides a retractable cable with a single connector at a free end.
Figure 4:
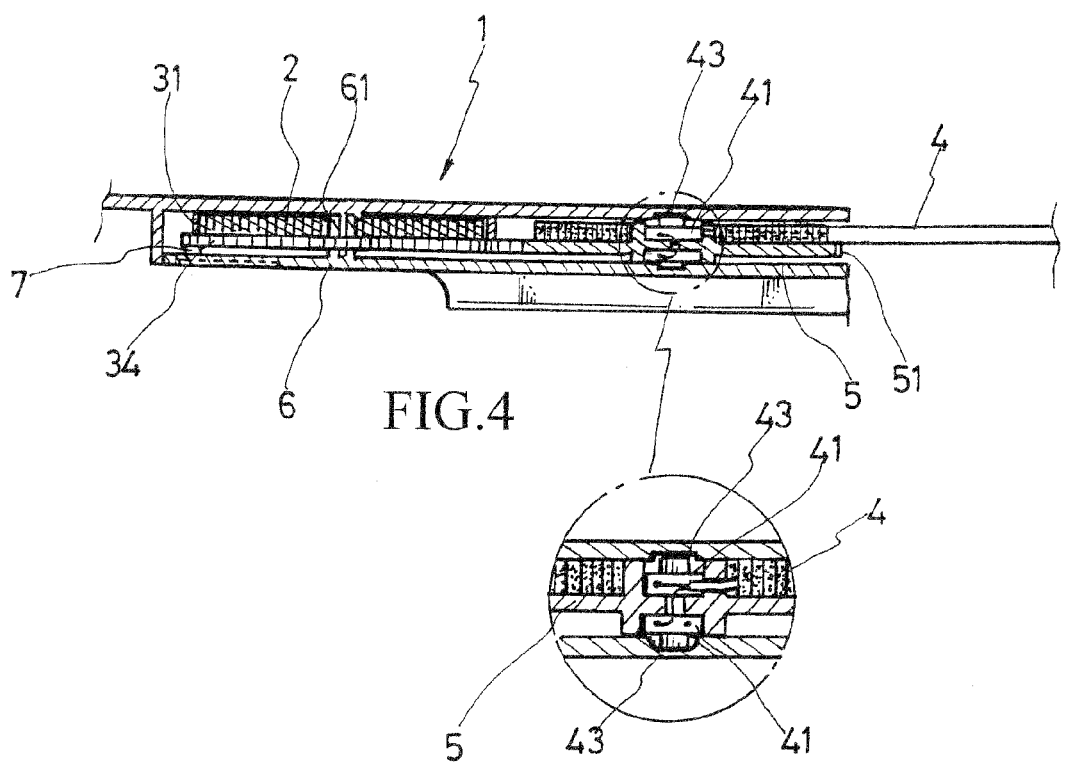
FIGS. 4 and 5 are sectional schematic diagrams showing how wires of the cable are connected inside the slider case of FIG. 1.
Figure 5:
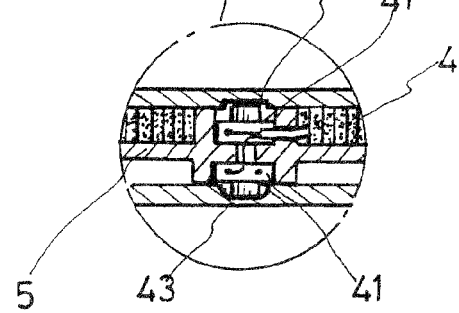

As shown in FIGS. 2 and 3, the cable 4 can be configured to be pulled in a single direction with a connector or multiple directors at a free end.

As shown in FIG. 3, a connector 42 is configured at a free end of the cable 4 while a positive wire and a negative wire out of the other end of the cable 4 are connected to an upper embedded element 41 and a lower embedded element 41, respectively. The upper embedded element 41 then connects an upper conducting plate 43, and the lower embedded element 41 connects a lower conducting plate 43. On the other hand, the positive and negative wires of another connector 421 are connected to the upper and lower conducting plates 43, respectively. In the present embodiment, the connector 42 at the cable 4's free end could be pulled to a desired length while the connector 421 is at a fixed length. Both connectors 42 and 421 are together exposed out of an opening of the casing member 1. The opening is in turn covered by the flip-open cover 7.

As shown in FIG. 2, the cable 4 is bended at a central location 44 and the central location 44 is fixed to the central axle 52. The entire cable 4 is then wound around the central axle 52 so that connectors 45 at the two ends of the cable 4 could be pulled and extended in the same direction. Both connectors 45 are together exposed out of an opening of the casing member 1. The opening is in turn covered by the flip-open cover 7.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the spirit of the present invention.

We claim:

1. A slider case, comprising a casing member, a coil spring, a rotary disc, a cable, a winding disc, a base plate, and a flip-open cover;
   wherein
   said casing member forms a space for a portable appliance to slide in; said base plate is positioned between said space and said casing member to form a thin space to house a cable retractor comprising said coil spring, said rotary disc, said cable, and said winding disc;
   said rotary disc has a top indentation with a central through hole; said rotary disc is rotatably and axially mounted on a pin of said casing member; a plurality of gear teeth are provided along a circumference of said rotary disc;
   said coil spring, accommodated in said indentation, is tightened or loosed along with said rotary disc's rotation direction;
   said winding disc positioned to a side of said rotary disc and has a plurality of gear teeth along a circumference of said winding disc which engages said gear teeth of said rotary disc; said winding disc is rotatably mounted to said casing member by a central axle; and
   said cable is wound around said central axle of said winding disc.

2. The slider case according to claim 1, wherein said coil spring has an inner end and an outer end, said inner end being fixedly connected a top end of said pin, and said outer end being fixedly connected to a circumferential wall of said indentation.

3. The slider case according to claim 1, wherein a spiral track and a centrifugal track are provided on a back side of said rotary disc and said casing member, respectively; a positioning ball is movably positioned inside said spiral track and said centrifugal track; together with said spiral track and said centrifugal track, said positioning ball provides a positioning function capable of temporarily stopping the extension and winding of said cable in successive steps.

4. The slider case according to claim 1, wherein a connector is configured at a free end of said cable; a positive wire and a negative wire out of the other end of said cable are connected to an upper embedded element and a lower embedded element, respectively; said upper embedded element then connects an upper conducting plate, and said lower embedded element connects a lower conducting plate; a positive and negative wires of another connector of are connected to said upper and lower conducting plates, respectively, at a fixed length.

5. The slider case according to claim 1, wherein said cable is bended at a central location; said central location is fixed to said central axle; said cable is then wound around said central axle so that two connectors at the two ends of said cable are freely pulled from or reeled back into a cable retractor.

* * * * *